United States Patent [19]

Fournier et al.

[11] Patent Number: 4,729,341

[45] Date of Patent: Mar. 8, 1988

[54] METHOD AND APPARATUS FOR MAKING ELECTROPHOTOGRAPHIC DEVICES

[75] Inventors: Eugene W. Fournier, Garden City; Erik J. Bjornard, Birmingham; Annette G. Johncock, Walled Lake; Joachim Doehler, Union Lake, all of Mich.

[73] Assignee: Energy Conversion Devices, Inc., Troy, Mich.

[21] Appl. No.: 934,365

[22] Filed: Nov. 24, 1986

Related U.S. Application Data

[63] Continuation of Ser. No. 777,096, Sep. 18, 1985, abandoned.

[51] Int. Cl.⁴ ............................................. C23C 16/48
[52] U.S. Cl. ...................................... 118/723; 427/38; 427/39
[58] Field of Search ...................... 427/38, 39; 118/723

[56] References Cited

U.S. PATENT DOCUMENTS

4,265,730 5/1981 Hirose ................................. 204/298
4,466,380 8/1984 Jansen ................................. 118/723
4,517,223 5/1985 Ovshinsky .............................. 427/39
4,526,805 7/1985 Yoshizawa ........................... 118/730

Primary Examiner—Richard R. Bueker
Attorney, Agent, or Firm—Marvin S. Siskind; Richard M. Goldman

[57] ABSTRACT

There are disclosed a method and apparatus for depositing a layer of material onto the outer surfaces of a plurality of cylindrical members. The cylindrical members are arranged to form a substantially closed loop with the longitudinal axes thereof disposed substantially parallel and the outer surfaces of adjacent members being closely spaced apart to form an inner chamber which is substantially closed. Adjacent cylindrical members form narrow passages which communicate with the inner chamber. At least one reaction gas is introduced into the inner chamber through at least one of the narrow passages and a plasma is formed from the at least one reaction gas within the inner chamber to deposit the layer of material onto the outer surfaces of the cylindrical members. The plasma can be formed by using either microwave energy or radio frequency energy. More particularly disclosed is a method and apparatus for making electrophotographic drums.

23 Claims, 5 Drawing Figures

METHOD AND APPARATUS FOR MAKING ELECTROPHOTOGRAPHIC DEVICES

This application is a continuation of application Ser. No. 777,096 filed on Sept. 18, 1985 now abandoned.

BACKGROUND OF THE INVENTION

This invention relates to a method and apparatus for making electrophotographic devices incorporating amorphous semiconductor alloys. The invention more particularly relates to a method and apparatus for making such devices by plasma deposition from reaction gases wherein the plasma are excited by radio frequency or microwave energy. The invention has its most important application in making commercial electrophotographic devices having a cylindrical or drum configuration with the amorphous semiconductor alloys coated or deposited on the outer surfaces thereof. The present invention makes possible for the first time the commercial mass production of electrophotographic drums incorporating amorphous semiconductor alloys.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction types. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films could not be successfully doped or otherwise modified to shift the Fermi level close to the conduction or valence bonds, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, (1975), toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and of p or n conduction types.

The reduction of the localized states was accomplished by glow discharge deposition of amorphous silicon films where a gas of silane ($SiH_4$) was passed through a reaction tube wherein the gas was decomposed by a radio frequency (RF) glow discharge and deposited on a substrate at a substrate temperature of about 500°–600° K. (227°–327° C.). The material so deposited on the substrate was an intrinsic amorphous material consisting of silicon and hydrogen. To produce a doped amorphous material, a gas of phosphine ($PH_3$) for n-type conduction or a gas of diborane ($B_2H_6$) for p-type conduction was premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronics properties of the amorphous material approximately more nearly those of the corresponding crystalline material.

The incorporation of hydrogen in the above RF deposition method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the RF silane deposited materials leads to a narrow depletion width, which in turn limits the efficiencies of solar cells and other devices whose operation depends on the drift of free carriers. The RF method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above-described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the new alloy so formed has a lower density of defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

About forty-five years ago, C. Carlson developed the first electrophotographic process based on a sulfur material. Other chalcogenides such as selenium and selenium alloys were thereafter suggested for such applications together with organic substances such as polyvinyl carbazole (PVK). These materials, however, exhibited certain deficiencies. They were toxic, and therefore difficult to handle, soft, and therefore subject to wear, and had poor infrared light photoresponse.

In view of the above noted deficiencies of these materials, silicon based amorphous semiconductor alloys were investigated for possible applications in electrophotographic processes. These materials were considered likely to be useful because of the hardness of amorphous silicon alloys, because of their nontoxic nature, and because of their improved photoresponse to infrared light. Also, as previously mentioned, these materials could be made with a density of states reduced to a point where charging of the materials to the potentials required for electrophotographic replication was considered possible. Thus, amorphous semiconductor alloys made by the processes hereinabove described have demonstrated photoresponsive and structural characteristics which are suited for electrophotographic applications. These prior art processes, however, have suffered from relatively slow deposition rates and low conversion efficiency of the reaction gas feed stock which are important considerations from the standpoint of using amorphous semiconductor materials on a commercial basis.

A new and improved process for making electrophotographic devices incorporating amorphous semiconductor alloys is disclosed in U.S. application Ser. No. 580,081, filed concurrently herewith, (Case 710) for "An Improved Method Of Making A Photoconductive Member And Improved Photoconductive Members Made Thereby, filed in the names of Annette G. Johncock and Stephen J. Hudgens, which is incorporated herein by reference. The process described therein is a microwave glow discharge deposition process which provides substantially increased deposition rates and reaction gas feed stock utilization. Among the many applications for amorphous semiconductor alloys, high deposition rates and reaction gas feed stock conversion efficiency and utilization are most essential for the commericial viability of electrophotographic devices utilizing such materials. High deposition rates and feed stock conversion efficiency and utilization are necessary because layer thicknesses of about 15 microns or more of amorphous semiconductor alloy is required in such devices to enable sufficient surface potential, about 350 volts, to be applied thereto. As a result, amorphous semiconductor alloys can be deposited at sufficient rates and have desired photoresponsive characteristics to enable the commercial utilization of such materials in electrophotographic devices.

The electrophotographic devices used in commercial practice usually take the form of cylindrical or drum members. The present invention provides an apparatus and method which facilitates the deposition of amorphous semiconductor alloys uniformly over the entire outer surface of such drums to form electrophotographic devices thereon. At the same time, all of the advantages of microwave glow discharge processes including high reaction gas feed stock utilization can be realized. A radio frequency glow discharge can be utilized when the deposition rate is not critical.

SUMMARY OF THE INVENTION

The invention provides a method of depositing a layer of material onto the outer surface of at least a pair of cylindrical members. The method includes the steps of forming an inner chamber including the pair of cylindrical members by aligning the members with the longitudinal axes thereof disposed substantially parallel and the outer surfaces of the members closely spaced apart to form the inner chamber and a narrow passage communicating with the inner chamber between the members. The method further includes the steps of introducing at least one reaction gas into the inner chamber through the narrow passage, wherein, the at least one reaction gas includes at least one element to be deposited, and forming a plasma from the at least one reaction gas within the inner chamber to deposit the layer of material containing the at least one element onto the outer surface of the cylindrical members.

The inner chamber, in accordance with the present invention, can be formed by forming a substantially closed loop of a plurality of the cylindrical members by aligning the members with the longitudinal axes thereof disposed substantially parallel and the outer surfaces of adjacent members closely spaced apart to form the inner chamber substantially closed and a narrow passage between adjacent members communicating with the inner chamber. The at least one reaction gas is then introduced into the inner chamber through at least one of the narrow passages.

The reaction gases can include silane ($SiH_4$), silicon tetrafluoride ($SiF_4$), germane ($GeH_4$), germanium tetrafluoride ($GeF_4$), diborane ($B_2H_6$), phosphine ($PH_3$), ammonia ($NH_3$), nitrogen ($N_2$), oxygen ($O_2$) and methane ($CH_4$) or combinations thereof. The plasma within the inner chamber can be formed by coupling microwave energy or radio frequency energy into the inner chamber.

The present invention further provides an apparatus for depositing a layer of material onto the outer surfaces of at least a pair of cylindrical members. The apparatus includes a substantially closed deposition chamber, means for aligning the members with the longitudinal axes thereof disposed substantially parallel with the outer surfaces of the members closely spaced apart to form a substantially closed inner chamber within the deposition chamber and a narrow passage communicating with the inner chamber between the members. The apparatus further includes means for introducing at least one reaction gas into the inner chamber through the narrow passage wherein the at least one reaction gas includes at least one element to be deposited onto the outer surfaces of the members. The apparatus further includes means for forming a plasma from the at least one reaction gas within the inner chamber to deposit the layer of material containing the at least one element onto the outer surface of the cylindrical members.

The apparatus can include means for aligning a plurality of the cylindrical members in a substantially closed loop with the longitudinal axes thereof disposed substantially parallel and the outer surfaces of adjacent members closely spaced apart to form the substantially closed inner chamber and a narrow passage between each pair of members communicating with the inner chamber. The reaction gas introducing means are arranged to introduce the reaction gas into the inner chamber through at least one of the narrow passages.

The plasma-forming means can include means for coupling radio frequency energy or microwave energy into the inner chamber. To facilitate the uniform deposition onto the outer surfaces of the cylindrical members, the apparatus can further include means for rotating the cylindrical members about their own longitudinal axes and means for rotating the microwave energy coupling means. The reaction gas introducing means preferably include means for introducing the reaction gas into the inner chamber through every other one of the narrow passages and means for pumping unused reaction gases from the inner chamber through the narrow passages other than the narrow passages through which the reaction gas is introduced into the inner chamber.

DETAILED DESCRIPTION OF THE PREFERRED EMBODIMENTS

Figure 1:
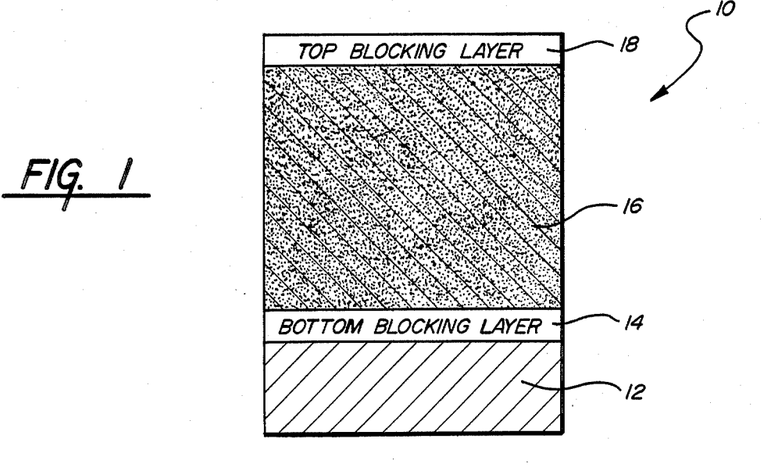
FIG. 1 is a partial cross-sectional view of a cylindrical member having materials deposited thereon in accordance with the present invention wherein the deposited materials adapt the cylindrical member for use as an electrophotographic device.

Referring now to FIG. 1, it illustrates, in partial cross-sectional side view, an electrophotographic device 10 of the type which can be formed in accordance with the present invention by depositing various materials onto the outer surface of a cylindrical member 12. The cylindrical member 12 forms the substrate of the electrophotographic device 10. The device 10 includes a first blocking layer 14 deposited onto the substrate 12, a photoconductive layer 16 deposited onto the first blocking layer 14, and a second blocking layer 18 deposited onto the photoconductive layer 16. The photoconductive layer 16 is preferably formed from an amorphous semiconductor alloy and more particularly, an amorphous silicon alloy containing nitrogen and hydrogen and/or fluorine. Depending upon the type of blocking layers 14 and 18 selected, and the type of charge utilized in charging the device 10, the photoconductive region 16 can also include small amounts of a dopant such as boron to render the region 16 substantially intrinsic. Similarly, the photoconductive region 16 can be rendered slightly n-type without any dopant included.

The bottom blocking layer 14 is provided to preclude charge injection from the substrate 12 into the photoconductive region 16. To that end, the bottom blocking layer 14 can be made insulative when formed from an amorphous alloy including silicon and carbon, silicon and oxygen, or silicon and nitrogen. In forming such bottom blocking layers, reaction gas mixtures of silane ($SiH_4$) and/or silicon tetrafluoride gas ($SiF_4$) with methane ($CH_4$), ammonia ($NH_3$), nitrogen ($N_2$) or oxygen can be used. Such blocking layers are suitable for both positive and negative charging of the electrophotographic device 10.

If positive charging of the electrophotographic device 10 is desired, the bottom electron blocking layer 14 can be, for example, a p-type amorphous silicon alloy formed from reaction gas mixtures including silane and/or silicon tetrafluoride with a p-type dopant-containing compound such as diborane ($B_2H_6$). In this case, it is also preferred that the photoconductive region 16 be formed from an amorphous silicon alloy which includes a small amount of p-type dopant rendering it substantially intrinsic.

If negative charging is desired, the bottom hole blocking layer can be, for example, an amorphous silicon alloy which is n-type. To form such a blocking layer, reaction gas mixtures of silane and/or silicon tetrafluoride with an n-type dopant-containing compound, such as phosphine ($PH_3$) can be used. In this case, the photoconductive layer 16 is preferably formed from an amorphous silicon layer which is slightly n-type.

The top blocking layer 18 can be formed from any of the materials mentioned with respect to the bottom blocking layer 14. Hence, the top blocking layer can be formed from an insulative material or a p-type or n-type amorphous semiconductor alloy as previously described above. For further details with respect to specific examples of some of the configuration and materials of electrophotographic devices of the type which can be made by the apparatus and method of the present invention, reference can be had to the aforementioned copending U.S. patent application Ser. No. 580,081, Case No. 710, filed concurrently herewith.

As disclosed in the above-mentioned copending application, the photoconductive region 16 is preferably thick in dimension, being on the order of 10 to 25 microns thick to facilitate a sufficient surface potential characteristic of the device. As also disclosed in that application, in order to make such devices on a commercial basis, it is necessary to deposit the materials forming the photoconductive region 16 by a method which exhibits high deposition rates. Conventional radio frequency glow discharge deposition techniques are not suitable for forming the entire 10 to 25 microns thick photoconductive region 16. However, as disclosed in the aforementioned copending application, microwave energy excited glow discharge plasmas facilitate the deposition of the photoconductive region 16 at deposition rates which render such devices to be commercially viable. The apparatus and method of the present invention contemplate utilization of microwave energy for forming a plasma from which the materials of the electrophotographic device can be deposited at such commercially viable rates and with gas feed stock utilization not heretofore possible.

The invention further contemplates that the photoconductive region 16 can be formed from both microwave and radio frequency glow discharge plasmas. In this case, the major portion of the photoconductive region 16 can be formed from microwave energy glow discharge plasmas and the remaining or top portion of the photoconductive region 16 can then be formed from radio frequency glow discharge plasmas. The apparatus and method of the present invention accommodates both modes of operation in order to facilitate the making of electrophotographic copier drums having desired photoresponsive and charge retention characteristics to render the devices especially useful for electrophotographic copying.

Figure 2:
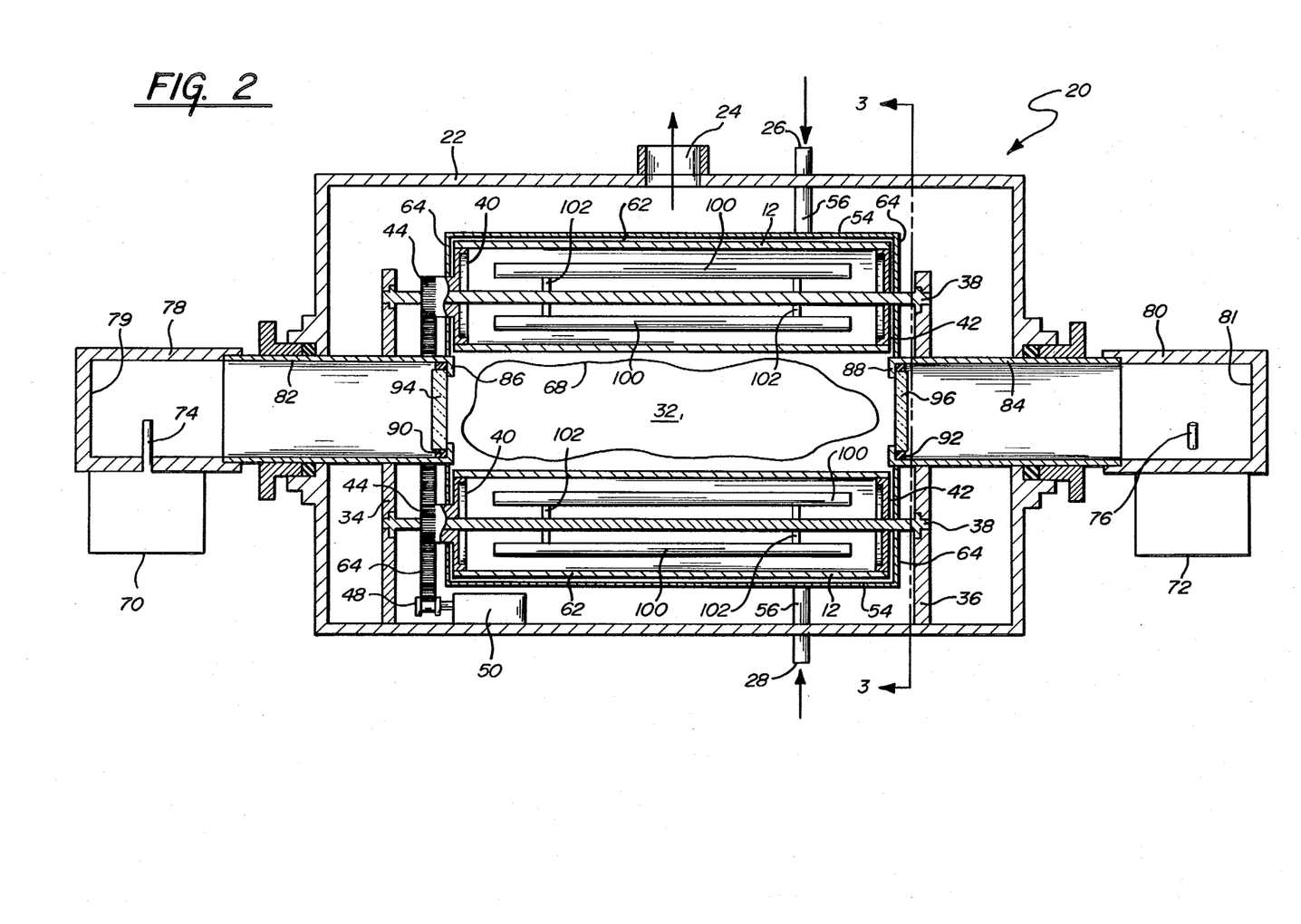
FIG. 2 is a side view partly in cross section of an apparatus embodying the present invention.
Figure 3:
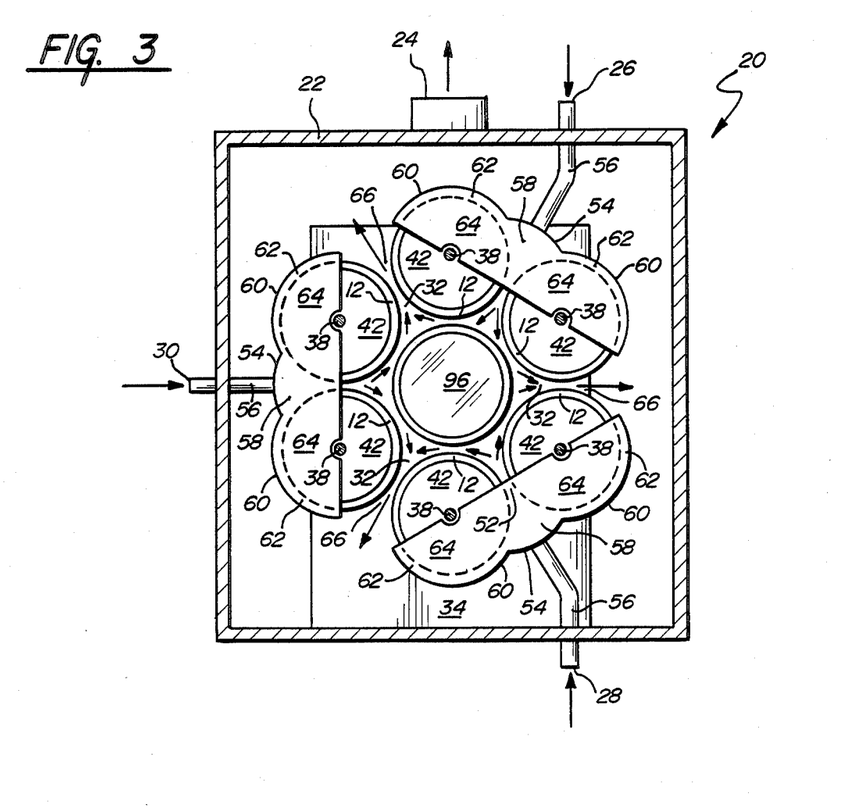
FIG. 3 is a cross-sectional view taken along lines 3—3 of FIG. 2.

Referring now to FIGS. 2 and 3, they illustrate an apparatus 20 embodying the present invention adapted for depositing a layer or layers of material, preferably amorphous semiconductor alloys, onto a plurality of drums or cylindrical members 12. The apparatus 20 includes a deposition chamber 22. The chamber 22 includes a pump-out port 24 adapted for suitable connection to a pump for pumping out reaction products from the chamber and to maintain the interior of the chamber at an appropriate pressure to facilitate the deposition process therein. The chamber 22 further includes a plurality of reaction gas input ports 26, 28, and 30 through which reaction gases are introduced into the deposition environment in a manner to be described hereinafter.

Within the chamber 22, there are supported a plurality of cylindrical members or drums 12. The drums 12 are arranged to form a substantially closed loop with the longitudinal axes of the drums being disposed substantially parallel and the outer surfaces of adjacent drums being closely spaced apart to form an inner chamber 32. For disposing the drums 12 in this manner, the chamber 22 includes a pair of upstanding walls 34 and 36 which support thereacross a plurality of stationary shafts 38. Each of the drums 12 is mounted for rotation on a respective one of the shafts 38 by a pair of disc-shaped spacers 40 and 42. The spacers 40 and 42 have an outer dimension corresponding to the inner dimension of the drums 12 to thereby make frictional engagement with the inner surfaces of the drums 12 for accurately positioning the drums with respect to one another. The spacers 40 include a sprocket 44 arranged to engage a drive chain 46. The drive chain 46 makes a continuous loop around the sprockets 44 and a drive sprocket 48 of a motor 50. As a result, and as will be further explained hereinafter, during the deposition process the motor 50 is energized to cause each of the drums 12 to be rotated about its own longitudinal axis. This facilitates a uniform deposition of the material being deposited over the entire outer surface of each of the drums 12.

As previously mentioned, the drums 12 are disposed so that the outer surfaces thereof are closely spaced apart to form the inner chamber 32. As can be noted in FIG. 3, the reaction gases from which the deposition plasma is formed are introduced into the inner chamber 32 through at least one of a plurality of narrow passages 52 formed between one pair of adjacent drums 12. Preferably, the reaction gases are introduced into the inner chamber 32 through every other one of the narrow passages 52.

In FIG. 3, it can be noted that each pair of adjacent drums 12 is provided with a gas shroud 54. Each shroud 54 is connected to one of the reaction gas inlets 26, 28, and 30 by a conduit 56. Each shroud 54 defines a reaction gas reservoir 58 adjacent the narrow passage through which the reaction gas is introduced. The shrouds 54 further include lateral extensions 60 which extend from opposite sides of the reservoirs 58 and along the circumference of the drums 12 to form narrow channels 62 between the shroud extensions 60 and the outer surfaces of the drums 12.

The shrouds 54 are configured as described above so that the gas reservoirs 58 permit relatively high reaction gas conduction while the narrow channels 62 provide a high resistance or low conduction of the reaction gases. Preferably, the vertical conductance of the reaction gas reservoirs 58 is much greater than the conductance of the narrow passages 52 between the drums. Further, the conductance of the narrow passages 52 is much greater than the conductance of the narrow channels 62. This assures that a large percentage of the reaction gas will flow into the inner chamber 32 and uniform gas flow along the entire lateral extent of the drums 12.

The shrouds 54 further include side portions 64 which overlap end portions of the drums 12 and spacers 42 and 44. The side portions 64 are closely spaced from the end portions of the drums 12 and spacers 42 and 44 to continue the narrow channels 62 across the ends of the drums. The side portions 64 thereby impede reaction gas flow around the ends of the drums.

As can also be noted in FIG. 3, in accordance with this preferred embodiment, the narrow passages 66 which are not utilized for reaction gas introduction into the inner chamber 32 are utilized for conducting reaction products from the inner chamber 32 and the chamber 22. When the pump which is coupled to the pump-out port 24 is energized, the interior of the chamber 22 and the inner chamber 32 is pumped out, with the inner chamber being pumped out through the narrow passages 66. In this manner, reaction products can be extracted from the chamber 22 and the interior of the inner chamber 32 can be maintained at a suitable pressure for deposition.

To facilitate the formation of the deposition plasma identified by reference character 68 in FIG. 2, the apparatus 20, in accordance with this preferred embodiment, further includes a first microwave energy source 70 and a second microwave energy source 72. Each of the microwave energy sources 70 and 72 includes an antenna probe 74 and 76, respectively. The microwave energy sources 70 and 72 can be, for example, microwave frequency magnetrons having an output frequency of, for example, 2.45 GHz. The magnetrons 70 and 72 are mounted to a cylindrical waveguide structure 78 and 80, respectively. The probes 74 and 76 are spaced from back walls 79 and 81 of the waveguides 78 and 80 by a distance of about one-quarter of the waveguide wavelength. This spacing maximizes the coupling of the microwave energy from the probes to the waveguides. The waveguide structures 78 and 80 are mounted for rotation onto another waveguide 82 and 84, respectively. The waveguides 82 and 84 project into the chamber 22 and terminate in close proximity to the edge portions of the drums 12. The end portions of the waveguides 82 and 84 include a lip portion 86 and 88. Against each of the lip portions 86 and 88 is disposed a sealing O-ring 90 and 92 each of which, together with the lip portions 86 and 88, supports a window 94 and 96. The windows 94 and 96 together with the drums 12 define the substantially closed inner chamber 32.

The waveguides 78 and 82 form a coupling means for coupling the microwave energy generated by the magnetron 70 into the inner chamber 32. Similarly, the waveguides 80 and 84 define a coupling means for coupling the microwave energy generated by magnetron 72 into the inner chamber 32. The microwave energy generated by the magnetrons 70 and 72 is radiated by the antenna probes 74 and 76. In order to avoid interaction between the probes 74 and 76, the antenna probes preferably are displaced from each other by an angle. In accordance with this preferred embodiment, the angle between the probes is about 60°. However, for systems incorporating a greater number of drums than the six drums illustrated herein, the angle of displacement between the antenna probes 74 and 76 will vary. The reason for this is that it is preferred that the antenna probes be disposed with respect to the drums 12 so that each probe forms an identical and uniform microwave energy field within the inner chamber 32.

The windows 94 and 96, in addition to enclosing the inner chamber 32, protects the magnetrons 70 and 72 from the reaction gases. They further serve to preclude the formation of a plasma at the magnetron probes 74 and 76 and they also provide a low loss coupling of the microwave energy into the inner chamber 32. To that end, the windows 94 and 96 can be formed from a material such as quartz, and have a thickness which provides a relatively low forward standing wave ratio into the inner chamber 32.

To further diminish the interaction between the magnetrons 70 and 72, each magnetron can be energized sequentially. For example, if alternating current is being utilized to energize the magnetrons, the magnetrons can be energized during alternate half cycles of the alternating current. In this manner, the interaction between the magnetrons can be further diminished.

As previously mentioned, the waveguides 78 and 80 are mounted for rotation on their respective waveguides 82 and 84. As a result, each of the magnetron sources 70 and 72 can be rotated about the longitudinal axis of the waveguides 82 and 84. Such rotation assures that the time average density of depositing species is radially uniform.

In utilizing the apparatus 20 of FIGS. 2 and 3 for depositing a material onto the outer surfaces of the drums 12, and more particularly for depositing layers of materials to form electrophotographic copier drums, the drums 12 are first mounted as illustrated and as described above. Thereafter, reaction gases are introduced through the inlet ports 26, 28, and 30 while the chamber 22 is pumped out by the pump coupled to the outlet 24. With the reaction gases introduced into the inner chamber 32, the magnetrons 70 and 72 are then energized to couple microwave frequency energy into the inner chamber 32 to form a glow discharge plasma therein. The microwave energy is readily coupled into the inner chamber 32, because the inner chamber itself defines a waveguide structure at microwave frequencies.

The motor 50 is then energized to cause the drums 12 to be rotated about their own longitudinal axes. The magnetrons 70 and 72 can then also be rotated about the waveguides 82 and 84 as previously described. As a result of the foregoing, a uniform deposition of material will ensue upon the entire outer surfaces of the drums 12.

During the deposition process, it may be desirable to heat the drums 12. To that end, the apparatus 20 further includes a plurality of heating elements 100 which are mounted to the stationary shafts 38 by spacers 102. Since the shafts 38 are stationary, the heating elements 100 will also be stationary within the drums 12. The heaters 100 can take the form of resistance heating elements or incandescent lamps. For the deposition of amorphous semiconductor alloys, the drums are preferably heated to a temperature between 20° C. and 400° C., and preferably, about 300° C. It can also be desirable to preheat the reaction gases prior to introduction thereof into the inner chamber 32. This can be accomplished, for example, by heating the shrouds 54 to about 300° C. by slug heaters incorporated therein or lamps disposed adjacent the shrouds 54 external to the deposition region.

For making an electrophotographic drum as illustrated in FIG. 1, the first blocking layer 14 as previously described can be formed from an insulative material, a p-type amorphous silicon alloy, or an n-type amorphous silicon alloy. When the blocking layer 14 is formed from an insulative material such as silicon nitride, silicon carbide, or silicon dioxide, the reaction gases introduced into the inner chamber during the deposition process can be silane ($SiH_4$) and/or silicon tetrafluoride ($SiF_4$) with methane, nitrogen, ammonia, or oxygen. Such a blocking layer can be utilized for both positive and negative charging of the electrophotographic drum.

When the blocking layer 14 is a p-type amorphous silicon alloy, the reaction gases introduced into the inner chamber 32 can be silane and/or silicon tetrafluoride with diborane. Such a blocking layer is suitable for an electrophotographic drum to be positively charged.

When the blocking layer 14 is to be formed from an n-type amorphous silicon alloy, the reaction gases introduced into the inner chamber can be silane and/or silicon tetrafluoride and phosphine gas. Such a blocking layer is suitable for an electrophotographic device to be negatively charged.

For making the photoconductive region 16, the photoconductive region 16 can be an amorphous silicon alloy incorporating silicon, hydrogen, and/or fluorine. Such a material can be deposited from reaction gases of silane, and/or silicon tetrafluoride, and hydrogen. If the photoconductive region is to be substantially intrinsic, diborane gas can also be utilized. If it is to be slightly n-type, no dopant is utilized.

In some instances, as fully described in cross-referenced Case 710 application Ser. No. 580,081, it may also be desirable to incorporate a layer of material in the photoconductive region 16 towards the top thereof which has a more narrow band gap than the bulk of the photoconductive region. To deposit such a material, germane ($GeH_4$) or germanium tetrafluoride ($GeF_4$) gas can also be introduced into the inner chamber 32. The germane or germanium tetrafluoride together with the silane and/or silicon tetrafluoride will form an amorphous silicon-germanium alloy having a reduced band gap for infrared photoresponsive applications. Also, as fully described in cross-referenced Case 710 application Ser. No. 580,081, a top blocking enhancement layer can be deposited before the top blocking layer 18 by RF deposition.

Lastly, for forming the top blocking layer 18, any of the materials and gas mixtures previously referred to for the bottom blocking layer 14 can be utilized. During the deposition of any one of the layers 14, 16, or 18, it may be desirable to introduce a plasma-sustaining gas such as argon. Also, the pressure within the inner chamber should be about 0.05 Torr or less.

Figure 4:
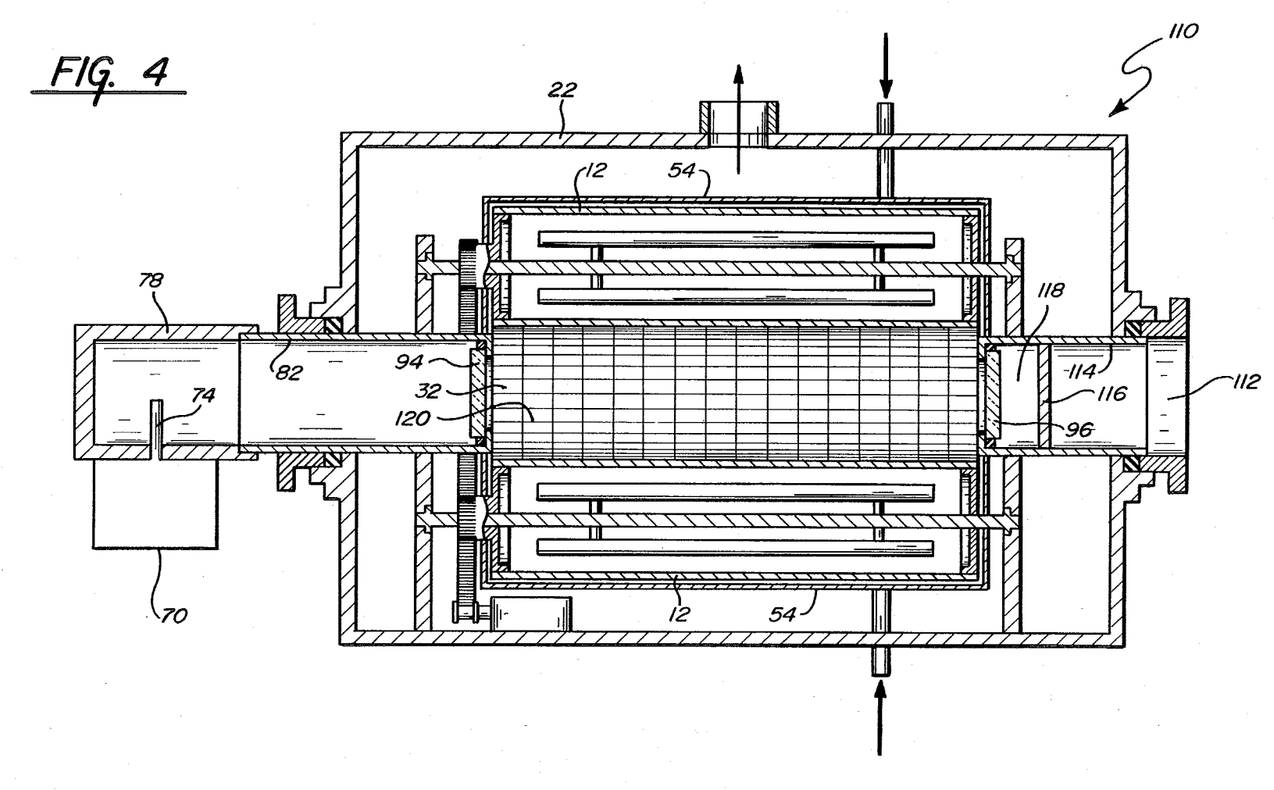
FIG. 4 is a side view, partly in cross section, of another apparatus embodying the present invention.

Referring now to FIG. 4, it illustrates another apparatus 110 embodying the present invention. The apparatus 110 in the major respects thereof is essentially identical to the apparatus 20 of FIG. 2. Therefore, the apparatus 110 will be described only to the extent of the differences between the apparatus 110 and the apparatus 20 of FIG. 2.

As can be noted from FIG. 4, the apparatus 110 includes a single source of microwave energy, magnetron 70. The other magnetron has been removed and a plate 112 is substituted therefor. The plate 112 makes contact with a cylindrical tube 114 which supports the window 96 at its end opposite the plate 112 and a wall 116 intermediate its ends. Within the space 118 between the window 96 and the wall 116 a microwave energy absorber such as water can be introduced by suitable means (not shown). As a result, a single magnetron 70 can be utilized for coupling microwave energy into the inner chamber 32. The microwave energy absorbing means formed by the water within the space 118 will absorb the microwave energy to avoid the formation of standing waves within the inner chamber 32. Again, during the deposition, the magnetron 70 can be rotated about the waveguide 82.

As will also be noted in FIG. 4, the apparatus 110 includes a cylindrical waveguide structure 120 formed from a wire mesh or screen. The waveguide structure 120 is disposed within the inner chamber 32 and preferably is closely spaced with respect to the drums 12. The waveguide structure 120 can be utilized to provide a more uniform and continuous waveguide structure and thereby provide more efficient propagation of the microwave energy within the inner chamber 32. However, the waveguide structure 120 will decrease the gas utilization efficiency of the system by a small amount inasmuch as deposition will take place on the waveguide structure 120.

Figure 5:
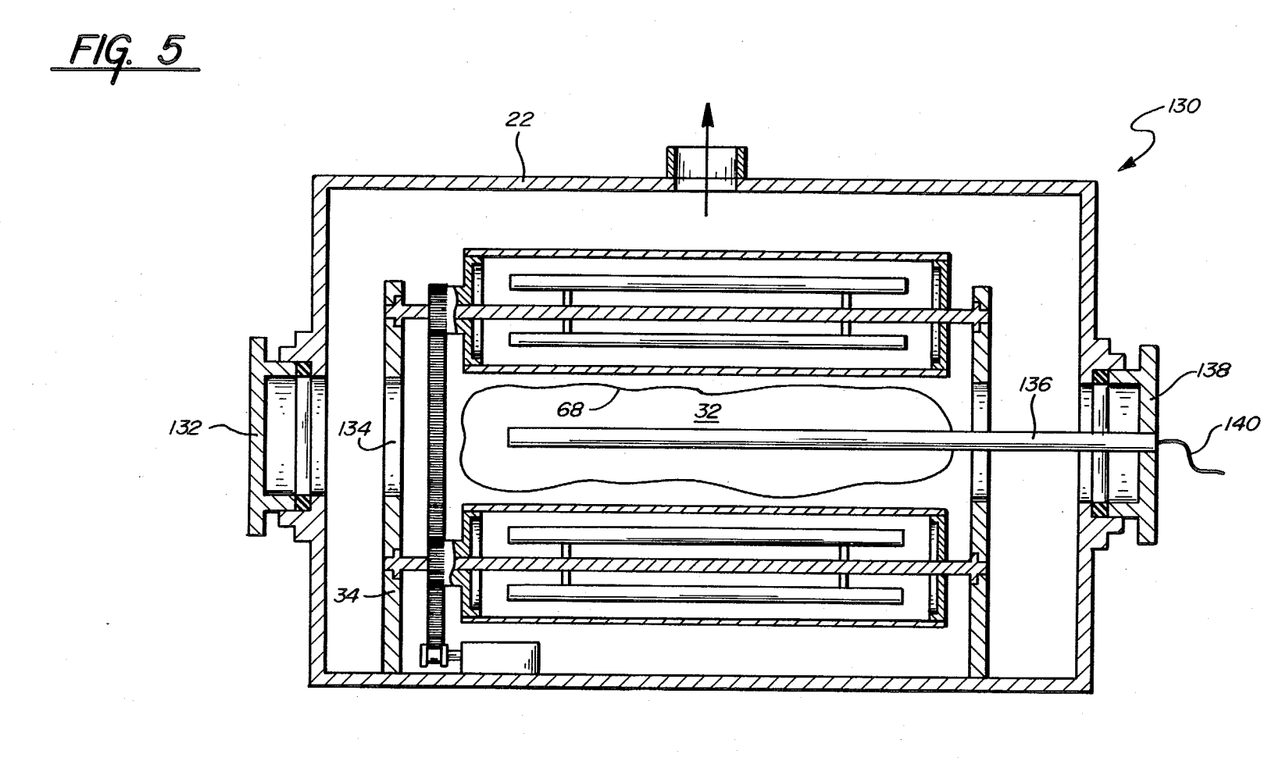
FIG. 5 is a side view, partly in cross section, of another apparatus embodying the present invention which includes structure for introducing radio frequency energy into the inner chamber of the apparatus for forming the plasma therein.

Referring now to FIG. 5, it illustrates another apparatus 130 which again is substantially similar to the apparatus 20 of FIG. 2. Here however, as can be noted, both microwave magnetrons have been removed. A plate 132 replaces the magnetron 70 and waveguide 82. Another plate 134 closes the opening formed in the upstanding wall 34 when the waveguide 82 is removed.

At the other end of the chamber 22, an elongated antenna structure 136 is disposed within the inner chamber 32. The antenna 136 is supported on an insulative plate 138 and includes a lead 140 adapted to be connected to a source of radio frequency energy. The antenna 136 together with the plate 134 forms a means for coupling radio frequency energy into the inner chamber 32. In accordance with the present invention, this structure permits radio frequency energy to be utilized for forming the plasma 68 within the inner chamber 32. As previously mentioned, it may be desired to form the bulk of the photoconductive region 16 by a microwave glow discharge plasma and form the upper portion of the photoconductive region 16 by a plasma excited by radio frequency energy. The antenna 136 together with the plate 134 facilitates such an RF glow discharge plasma within the inner chamber 32.

As can be appreciated from the foregoing, the present invention provides a new and improved apparatus and method for depositing a material onto the outer surfaces of a plurality of cylindrical members. The method and apparatus of the present invention is particularly applicable in making electrophotographic drums on a commercial scale. Because microwave glow discharge deposition is made possible by the present invention over large surface areas of cylindrical members, electrophotographic drums can be produced on a commercial scale. Such a process is rendered commercial by both the high deposition rate achievable with microwave glow discharge deposition and also by the high gas utilization efficiency of the system and method of the present invention. Gas utilization efficiencies of greater than 84% are possible. The high gas utilization efficiency is due both to substantially one-hundred percent of the feed gas stock being converted into depositing species in the low pressure microwave plasma and to the geometrical disposition of the cylinder, which allows a large fraction of the depositing species to impinge upon the desired deposition surface.

In addition, although the present invention has been particularly described with respect to the formation of electrophotographic drums, it can be appreciated by those skilled in the art that the method and apparatus of the present invention is useful for other purposes. Also, in practicing the present invention in accordance with the broader aspects thereof, the inner chamber 32 can be formed from just a pair of cylindrical members provided that an adjacent wall structure, such as adjacent walls of the chamber 22 are utilized, for forming with the pair of cylindrical members, the inner chamber. Additionally, clusters of drums can be aligned end to end to enable the simultaneous processing of multiple groups of the drums. As a result of the foregoing, it can be seen that the present invention can be practiced in a manner otherwise than as specifically described herein.

What is claimed is:

1. Apparatus for depositing a layer of material onto the outer surface of a plurality of substantially cylindrically-shaped members, said apparatus comprising:
    a substantially closed deposition chamber;
    a plurality of substantially cylindrically-shaped members;
    said members aligned in a substantially closed loop with the longitudinal axes thereof disposed substantially parallel to one another; the outer surfaces of adjacent members closely spaced apart to form a substantially closed inner chamber;
    means for introducing at least one reaction gas into the inner chamber, said at least one reaction gas including at least one element to be deposited;
    means for forming a plasma from said at least one reaction gas introduced into said inner chamber to deposit a uniform layer of material containing said at least one element onto at least a portion of the outer surfaces of each of said cylindrically-shaped members; and
    said plasma forming means including microwave generation means for initiating the radiation of microwaves externally of said deposition chamber and waveguide means positioned externally of said deposition chamber for directly transmitting said radiated microwaves into said inner chamber; said deposition of said uniform layer substantially limited to those portions of said outer surfaces of said members disposed within said inner chamber.

2. An apparatus as defined in claim 1 further including means for rotating each of said cylindrical members about its own longitudinal axes.

3. An apparatus as defined in claim 1 wherein said plasma forming means includes means for coupling radio frequency energy into said inner chamber.

4. An apparatus as defined in claim 3 wherein said radio frequency energy coupling means comprises an elongated antenna arranged to be received within said inner chamber.

5. An apparatus as defined in claim 1, wherein said microwave energy coupling means comprises a first microwave energy source disposed at one end of said inner chamber.

6. An apparatus as defined in claim 5 further including a window disposed between said first microwave energy source and said inner chamber for limiting reflected microwave energy back to said first microwave energy source.

7. An apparatus as defined in claim 5 wherein said microwave energy coupling means further comprises a second microwave energy source disposed at the end of said inner chamber opposite said first microwave energy source.

8. An apparatus as defined in claim 7 wherein said first and second microwave energy sources include antenna probes, and wherein said probes are disposed at an angle with respect to each other.

9. An apparatus as defined in claim 7 further including a window disposed between each said source and said inner chamber.

10. An apparatus as defined in claim 5 further including means for absorbing microwave energy disposed at the end of said inner chamber opposite said first magnetron.

11. An apparatus as defined in claim 1 wherein said reaction gas introducing means includes means for introducing said reaction gas into said inner chamber through every other one of said narrow passages.

12. An apparatus as defined in claim 11 wherein said reaction gas introducing means comprises a gas reservoir adjacent said every other one of said narrow passages and a narrow channel extending from said reservoir along the outer peripheries of said adjacent cylindrical members.

13. An apparatus as defined in claim 12 wherein said reaction gas introducing means includes a shield extending over the ends of said cylindrical members to impede reaction gas flow over the ends of said cylindrical members.

14. An apparatus as defined in claim 1 including means for pumping unused reaction gases from said inner chamber through the narrow passages other than the narrow passages through which said reaction gas is introduced into said inner chamber.

15. An apparatus as defined in claim 1 further including means for heating said cylindrical members.

16. An apparatus as defined in claim 15 wherein said heating means is arranged to maintain the temperature of said members between about 20° Centigrade and 400° Centigrade.

17. An apparatus as defined in claim 15 wherein said heating means comprises a heating element disposed within each of said cylindrical members.

18. An apparatus as defined in claim 14 wherein said pumping means is arranged for maintaining the pressure within said inner chamber at about 0.05 Torr or less.

19. An apparatus as defined in claim 1, wherein maintaining the power density of said microwave energy within said inner chamber between about 0.1 to 1 watt per cubic centimeter.

20. An apparatus as defined in claim 19 wherein said microwave energy coupling means is arranged to provide microwave energy at a frequency of about 2.45 gigahertz.

21. An apparatus as defined in claim 1 wherein said reaction gas introducing means includes means for providing a substantially uniform flow of said reaction gas through said narrow passage along the length of said cylindrical members.

22. An apparatus as defined in claim 21 wherein said reaction gas introducing means further includes reaction gas reservoir means disposed along the length of said narrow passage adjacent said cylindrical members opposite said inner chamber for providing said gas reservoir with a gas conductance path adjacent and along the length of said cylindrical members and said narrow passage which is substantially greater than the gas conductance path through said narrow passage.

23. An apparatus as defined in claim 22 wherein said reaction gas reservoir means further includes gas flow channel means around the periphery of said cylindrical members for providing a gas conductance path substantially less than the gas conductance path through said narrow passage.

* * * * *